(12) United States Patent
Liang et al.

(10) Patent No.: US 6,905,801 B2
(45) Date of Patent: Jun. 14, 2005

(54) HIGH PERFORMANCE EUV MASK

(75) Inventors: Shoudeng Liang, Sunnyvale, CA (US); Pei-Yang Yan, Saratoga, CA (US); Guojing Zhang, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 77 days.

(21) Appl. No.: 10/334,175

(22) Filed: Dec. 28, 2002

(65) Prior Publication Data

US 2004/0126670 A1 Jul. 1, 2004

(51) Int. Cl.⁷ .................................................. G03F 9/00
(52) U.S. Cl. ........................................................ 430/5
(58) Field of Search ........................... 430/5, 312, 314; 378/34, 35

(56) References Cited

U.S. PATENT DOCUMENTS 6,673,520 B2 * 1/2004 Han et al. .................... 430/313
2004/0091789 A1 * 5/2004 Han et al. ........................ 430/5

* cited by examiner

*Primary Examiner*—S. Rosasco
(74) *Attorney, Agent, or Firm*—Blakely, Sokoloff, Taylor & Zafman LLP

(57) ABSTRACT

An extreme ultraviolet light (EUV) mask structure and method are disclosed to address the structural and processing requirements of EUV lithography. A mask absorber layer anisotropically etched with minimal etch bias at a relatively fast etch rate, is combined with a thin ruthenium layer, to produce a mask obviating the need for a conventional buffer or cap layer.

27 Claims, 4 Drawing Sheets

*Prior Art*

US 6,905,801 B2

HIGH PERFORMANCE EUV MASK

BACKGROUND OF THE INVENTION

Extreme ultraviolet (EUV) lithography, which is based upon exposure with the portion of the electromagnetic spectrum having a wavelength of 10–15 nanometers, may be used to print features with smaller critical dimension (CD) than other more conventional techniques, such as those utilizing deep ultraviolet (DUV) radiation. For example, an EUV scanner may use 4 imaging mirrors and a Numerical Aperture (NA) of 0.10 to achieve a CD of 50–70 nm with a depth of focus (DOF) of about 1.00 micrometer (um). Alternatively, an EUV scanner may use 6 imaging mirrors and a NA of 0.25 to print a CD of 20–30 nm although the DOF will be reduced to about 0.2 um.

Masking and reflection of EUV radiation brings about a unique set of challenges generally not encountered with DUV radiation. For example, a mask for DUV lithography is transmissive, and layers of materials such as chrome and quartz may be used to effectively mask or transmit, respectively, DUV radiation. Thus, a desired pattern on a DUV mask may be defined by selectively removing an opaque layer, such as chrome, to uncover portions of an underlying transparent substrate, such as quartz. However, virtually all condensed materials absorb at the EUV wavelength, so a mask for EUV lithography is reflective, and the desired pattern on an EUV mask is defined by selectively removing portions of an absorber layer ("EUV mask absorber") to uncover portions of an underlying mirror coated on a substrate. The mirror, or reflective multilayer ("ML"), generally comprises a number of alternating layers of materials having dissimilar EUV optical constants or indices of refraction. A cap or capping layer may be positioned upon the reflective multi-layer to protect the multi-layer from degradation during process treatments. For example, a silicon cap layer may be used to prevent oxidation of molybdenum layers comprising a reflective multi-layer.

Selective removal of portions of the EUV mask absorber generally involves etching spaces or trenches through portions of the EUV mask absorber material, and the CD uniformity and bias are highly dependent upon the accuracy of such etching. Toward the end of defect-free mask and print features for making microelectronic devices, inspection and repair techniques are utilized before EUV irradiation. To protect the reflective multi-layer during repair procedures, a buffer layer may be positioned between the reflective multi-layer and the EUV mask absorber material. Subsequent to repair, the buffer layer is etched away in preparation for EUV irradiation of the reflective multi-layer.

The integration of a buffer layer, and subsequent removal of a portion thereof, adds complexity and expense to the EUV mask patterning process. The use of a buffer layer also generally results in a thicker absorber stack, which increases undesirable shadowing effects in stepper imaging. A more simplified integration providing similar functionality would be preferred.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1A:
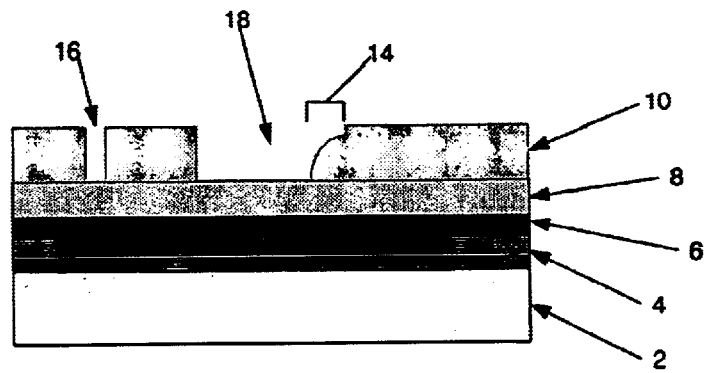
FIGS. 1A–1C are a cross-sectional depictions of a conventional EUV mask.
Figure 1B:
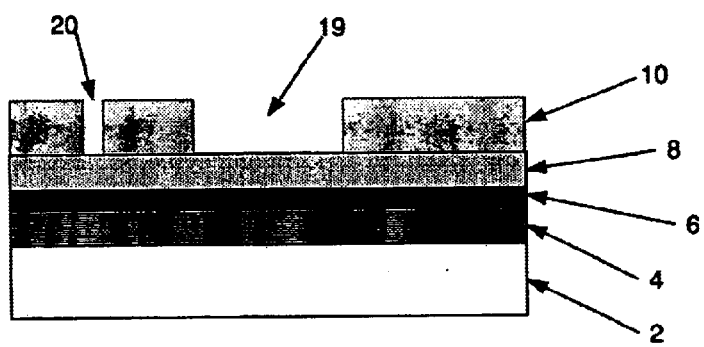
Figure 1C:
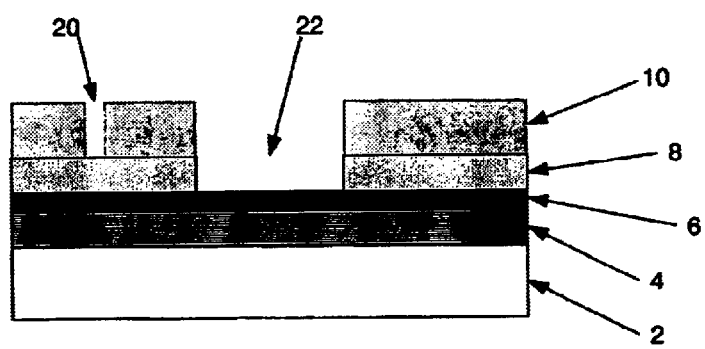

Referring to FIG. 1A, a conventional EUV masking scenario is depicted, having a substrate layer (2), a reflective multi-layer (4) or multi-layer "stack", a cap layer (6), a buffer layer (8), and an EUV mask absorber layer (10), with a trench (18) formed through the EUV mask absorber layer (10) to expose the buffer layer (8). Also depicted are a clear defect (16) and an opaque defect (14), the clear defect (16) representing a portion of the absorber layer which has been removed undesirably and is now missing, and the opaque defect (14) representing an extra remaining portion of the EUV absorber layer (10) or other material which remains in a position which is desirably unoccupied by such material. Defects may be inspected using conventional techniques which typically utilize non-EUV wavelength radiation, such as UV/DUV light at a wavelength of between about 150 nanometers and 500 nanometers. During inspection, images of a patterned mask are compared with exemplary mask images from a database, and defects are identified as signal differences. Subsequent to identification of defects, such as the clear (16) and opaque (14) defects depicted in FIG. 1A, the defects may be corrected or removed using conventional techniques such as focused ion beam irradiation for removing opaque defects, and deposition of opaque repair material (20), to produce a result such as that depicted in FIG. 1B, wherein the trench (19) is substantially free of unrepaired defects, as is the EUV absorber layer (10). One of the key functions of the buffer layer (8) is to protect the underlying reflective multi-layer (4) from treatments to form the trench (19) and repair defects such as those depicted in FIG. 1A (14, 16). For example, a buffer layer (8) may be utilized to protect an underlying reflective multi-layer (4) from sputtering or implanted ions during defect repair using focused ion beam treatment, which involves bombarding a target surface with ions, and the buffer layer (8) configured for such an application is geometrically constrained in that it must have a thickness sufficient to protect the underlying layers. A conventional buffer layer (8) made from materials such as silicon dioxide or silicon oxynitride, must be in the range of about 40–60 nanometers in thickness to protect an underlying multi-layer during focused ion beam treatment. This is an undesirable geometric constraint. After defects have been repaired, the portion of the buffer layer (8) at the bottom of the trench (19), as depicted in FIG. 1B, is etched and removed to expose the cap layer (6) and underlying reflective multi-layer (4). The cap layer (6), positioned to isolate the reflective multi-layer (4) from environment-related degradation processes such as oxidation of molybdenum which may comprise the reflective multi-layer (4), may comprise a layer of silicon having a thickness of about 11 nanometers.

Figure 2A:
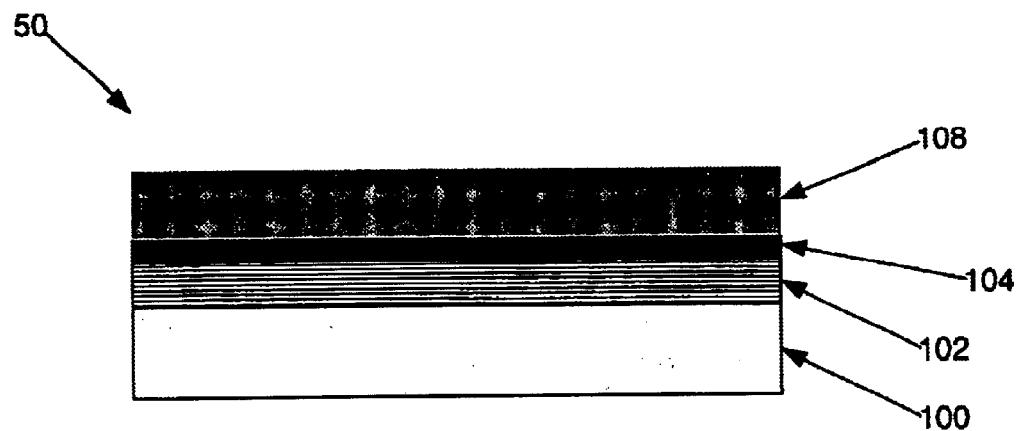
FIGS. 2A–2D are cross sectional views of various aspects of one embodiment of an EUV mask according to the present invention.

Referring to FIG. 2A, a cross sectional view of one embodiment of the invention is depicted, wherein a reflective multi-layer (102) is positioned between a substrate layer (100) and a ruthenium layer (104), and an EUV absorber layer (108) is positioned adjacent the ruthenium layer (104). Neither a conventional buffer layer, comprising a material such as silicon dioxide or silicon oxynitride, nor a conventional cap layer, comprising a thin layer of silicon, are present-they are replaced in the depicted embodiment by the ruthenium layer (104). The substrate layer (100), preferably comprising a material with a low defect level and a smooth surface such as glass or glass-ceramic with a low coefficient of thermal expansion ("CTE"), preferably is used as the starting material for an EUV mask of the present invention. In certain cases, the substrate (100) may be formed from silicon despite the relatively large CTE of silicon, so long as heat can be removed uniformly and effectively during exposure.

The reflective multi-layer (102) preferably comprises about 20–80 pairs of alternating layers of a high index of refraction material and a low index of refraction material. As would be apparent to one skilled in the art, a high index of refraction material includes elements with high atomic number which tend to absorb EUV light, and a low index of refraction material includes elements with low atomic number which tend to transmit EUV light. The choice of materials for the reflective multi-layer (102) depends upon the illumination wavelength ("lambda"). To a first approximation, each layer has a thickness of about one quarter of lambda. More specifically, the thickness of the individual layers depends on the illumination wavelength, lambda, and the incidence angle of the illumination light. For EUV, the wavelength is about 13.4 nm and the incidence angle is about 5 degrees. The thicknesses of the alternating layers are tuned to maximize the constructive interference of the EUV light reflected at each interface and to minimize the overall absorption of the EUV light. The reflective multi-layer (102) preferably can achieve about 60–75% reflectivity at the peak illumination wavelength. In one embodiment, the reflective multi-layer (102) comprises about 40 pairs of alternating layers of a high index of refraction material and a low index of refraction material. For example, each high index of refraction layer may be formed from about 2.8 nanometer thick molybdenum while each low index of refraction material may be formed from about 4.2 nanometer thick silicon.

The reflective multi-layer (102) preferably is formed over the substrate (100) using ion beam deposition or DC magnetron sputtering. The thickness uniformity preferably is better than 0.8% across the substrate (100). Ion beam deposition may result in less perturbation and fewer defects in the upper surface of the reflective multi-layer (102) because the deposition conditions usually may be optimized to smooth over any defect on the substrate layer (100). DC magnetron sputtering may be more conformal, thus producing better thickness uniformity, but substrate (100) defect geometry tends to propagate up through the alternating layers to the upper surface of the reflective multi-layer (102).

Figure 3:
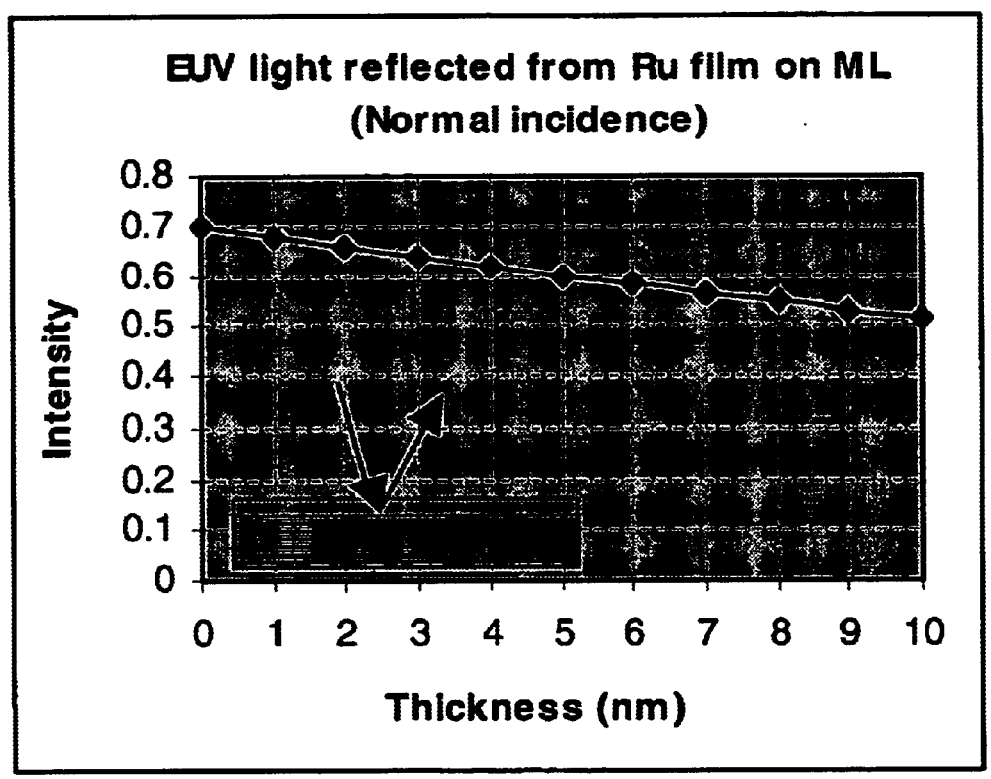
FIG. 3 is a chart depicting EUV irradiation intensity change as a function of ruthenium layer thickness as positioned above a reflective multi-layer.

Referring again to FIG. 2A, a ruthenium layer (104) is positioned immediately adjacent the reflective multi-layer (102). The ruthenium layer (104) preferably has a thickness between about 2 nanometers and about 6 nanometers and preferably is deposited using the same aforementioned techniques as the alternating layers of the preferred reflective multi-layer (102). Other conventional techniques, such as physical or chemical vapor deposition, or plasma enhanced chemical vapor deposition, may also be utilized to form the ruthenium layer (104). The aforementioned thickness range is preferred for the ruthenium layer (104) because such a layer of ruthenium is sufficiently thick to prevent etching damage to the reflective multi-layer, due to the selectivity of preferred etch techniques for the preferred EUV absorber layer materials as discussed below, and is thin enough to limit the EUV irradiation loss during masking to less than about 10% intensity loss with normal incidence reflection, as illustrated in FIG. 3. For example, referring to FIG. 3, with a 2 nanometer ruthenium film, about 0.66 of the intensity is reflected, as opposed to about 0.70 of the intensity reflected without the 2 nanometer ruthenium film—a decrease, or loss, of about 0.04/0.70, or about 6%, of the intensity.

The depicted EUV absorber layer (108) preferably comprises an EUV absorbing material which etches highly selectively in the presence of ruthenium, to prevent overetching through or past the ruthenium layer (104) and into the reflective multi-layer (102), and also etches with minimal etch bias, to enable trenches with substantially straight and parallel sides and enhance feature size resolution. Tantalum nitride etches much more anisotropically than certain other conventional EUV mask absorber materials such as chromium, with a negative etch bias between about 0 nanometers and about 10 nanometers for a 100 nanometer thick layer. Tantalum nitride also etches relatively fast —between about 32 and about 37 angstroms per second using chlorine plasma, as compared with chromium, which etches at a rate about 1/10 that of tantalum nitride with a chlorine and oxygen plasma (about 3–4 angstroms per second), and preferred etching chemistries, such as chlorine based dry etch chemistries introduced using conventional plasma etching techniques, are selective to tantalum nitride versus ruthenium, as discussed in further detail below. Tantalum oxynitride may be similarly etched, and is preferred as a component of the preferred EUV absorber layer due to its low reflectivity of non-EUV radiation, such as UV/DUV radiation, which is preferably utilized during defect inspection, as described in further detail below. As disclosed in U.S. patent application Ser. No. 09/823,637 for "Enhanced Inspection of Extreme Ultraviolet Mask" to the same inventors and assignee as the present invention, a top layer of material having low reflectivity of non-EUV radiation, such as UV/DUV radiation, may enhance the contrast available for inspection techniques. The preferred EUV absorber layer (108) comprises a layer of EUV absorbing material, preferably tantalum nitride with a thickness between about 40 nanometers and about 70 nanometers, positioned immediately adjacent the ruthenium layer (104), and a layer of material having low reflectivity of non-EUV radiation ("non-EUV-reflective"), preferably tantalum oxynitride with a thickness between about 10 nanometers and 30 nanometers, positioned over the layer of EUV absorbing material. The layer of EUV absorbing material and the layer of non-EUV-reflective material, together comprising the preferred EUV absorber layer (108), have an aggregate thickness preferably between about 70 nanometers and about 100 nanometers. An EUV absorber layer (108) thicker than about 100 nanometers may result in undesirable shadowing problems, while an EUV absorber layer (108) having a thickness less than about 70 nanometers may be susceptible to inadequate absorption or "leakage", depending upon the materials utilized. The EUV absorber layer (108) may be formed using conventional techniques, such as DC sputtering, ion beam deposition, and atomic layer chemical vapor deposition. In the preferred embodiment, a layer of tantalum nitride is first deposited adjacent the ruthenium layer (104), subsequent to which a layer of tantalum oxynitride is deposited adjacent the tantalum nitride layer. Other conventional techniques may also be applied to form the preferred combination of tantalum nitride and tantalum oxynitride, as would be apparent to one skilled in the art.

Figure 2B:
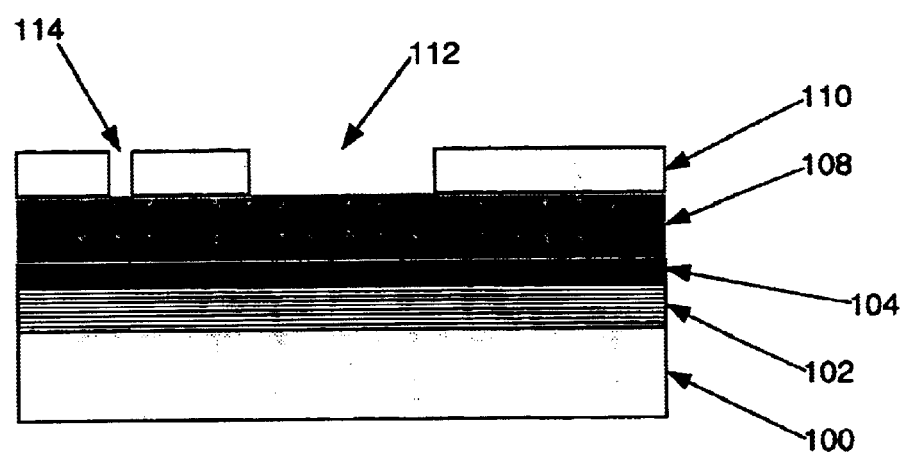
Figure 2C:
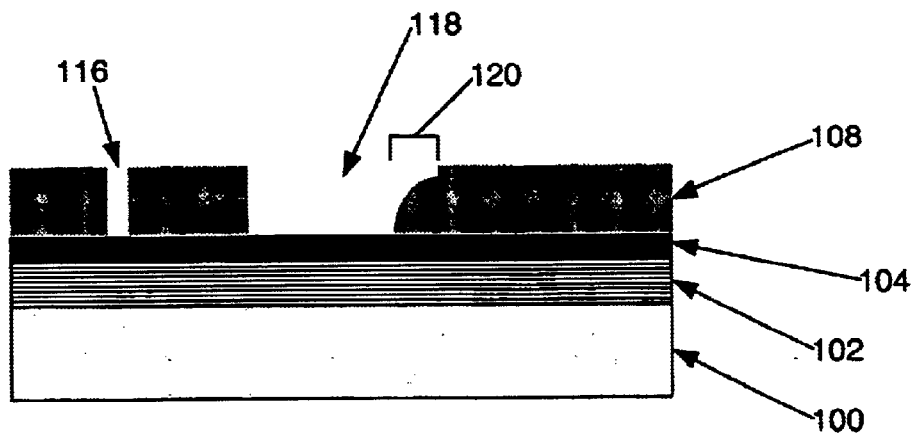
Figure 2D:
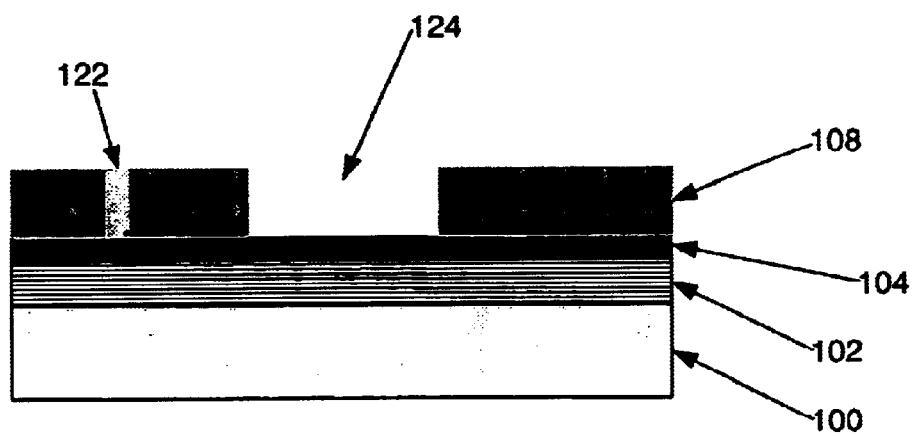

The depicted substrate (100), reflective multi-layer (102), ruthenium layer (104), and EUV absorber layer (108) comprise a mask blank (50) which may be further processed for EUV masking purposes, as illustrated in FIGS. 2B–2D.

As shown in FIG. 2B, a radiation sensitive layer, such as a photoresist layer (110) ("resist layer"), is coated upon the EUV absorber layer (108). The resist layer (110) is patterned using conventional techniques, such as e-beam writing, to form a trench (112), subsequent to which the dimensions of the post-develop trench (112) may be measured for critical dimension confirmation. A defect (114) in the patterned resist layer (110) is depicted. As shown in FIG. 2C, the pattern of the resist layer (110) is transferred into the EUV absorber layer (108), preferably by introducing a plasma etch chemistry highly selective to the EUV absorber layer (108) as opposed to the underlying ruthenium layer (104) to the exposed portions of the EUV absorber layer (108) to extend the trench (112) depicted in FIG. 2B to an enlarged trench (118) as depicted in FIG. 2C. The plasma etch for the preferred composite EUV absorber layer (108) of tantalum oxynitride and tantalum nitride may comprise, for example, chlorine gas ($Cl_2$) at a power of about 400 watts, field of about 150 gauss, and pressure of about 60 milliTorr. Chlorine plasma etch chemistries ("chlorine plasma") such as the aforementioned one are known to be effective on many materials used in microelectronic processing and manufacturing, such as tantalum nitride, and in this application are advantageous for relatively anisotropic and fast etching, as described above. The ruthenium layer (104) serves as an etch stop layer with etch chemistries such as the aforementioned, due to the high etch selectivity of such chemistries to the EUV absorber materials as compared to the ruthenium. The selectivity of the aforementioned preferred etch chemistry to tantalum nitride over ruthenium, for example, is about 70:1. After etching through the EUV absorber layer (108), the enlarged trench (118) preferably has sidewalls which are substantially straight and parallel due to the substantial lack of negative etch bias available with the aforementioned materials and techniques, although defects (120, 116) may be present after the etching treatment. The underlying ruthenium layer (104) and reflective multi-layer (102) may then be exposed to EUV irradiation directed through the enlarged trench (118). As shown in FIG. 2C, the resist layer (110) of FIG. 2B has been removed using conventional techniques and a clear defect (116) and an opaque defect (120) are depicted within the EUV absorber layer (108). Defect inspection, typically involving irradiation with non-EUV radiation, such as UV/DUV light at a wavelength of between about 150 nanometers and about 500 nanometers, is based upon a comparison of the light signals in the trenched or patterned regions, relative to non trenched regions. The preferred embodiment, having a non-EUV-reflective, and in particular, non or minimally-UV/DUV reflective, material forming the top portion of the EUV absorber layer (108), improves inspection contrast by making the un-trenched portions of the EUV absorber layer appear significantly darker than the trenched portions adjacent the reflective multi-layer (102) in UV/DUV radiation. Defect inspection may employ an optical inspection system, such as those available from KLA-Tencor Corporation, or a microscope such as a Zeiss Axiotron DUV microscope. The inspection may be performed at a wavelength of 248 nanometers or 193 nanometers with numerical aperture of 0.90–0.95, an eyepiece of magnification of 10×, and an objective magnification of 100–150×. During production, masks may be inspected using automated tools. A variety of light sources, including lasers, may be used to provide UV/DUV wavelengths. Typical wavelengths include, but are not limited to, 488 nm, 365 nm, 266 nm, 257 nm, 248 nm, 198 nm, and 193 nm. The shorter wavelengths provide better resolution and are necessary as the features on the mask become smaller. The inspection may be based on die-to-die or die-to-database. The mask inspection tools may combine optical techniques with scanning of the mask to acquire images. If desired, the inspection may evaluate phase as well as amplitude.

Repair of defects in the EUV absorber layer (108) preferably is performed with a conventional electron beam, or "e-beam" tool as needed. E-beam is preferred for deposition and etching with the preferred ruthenium layer (104) for the lack of sputtering or splattering type inaccuracy, as may be present with focused ion beam treatment, and available very high selectivity, in the range of 100:1, to targeted materials as opposed to ruthenium. A clear defect (116), for example, may be filled in with a conventional opaque repair material (122), as shown in FIG. 2D. Metals, for example, may be deposited with precursors such as organometallic or halide compounds, as would be apparent to one skilled in the art. An opaque defect 120 may be etched or removed using highly selective electron-beam-induced chemical etching with fluorine or chlorine etch chemistries, such as $XeF_2$, which are highly selective to the defect material as opposed to the adjacent ruthenium layer (104). Subsequent to repair, the trench (124) preferably is substantially free of unrepaired defects, as is the EUV absorber layer (108).

Thus, a novel EUV mask solution is disclosed. Although the invention is described herein with reference to specific embodiments, many modifications therein will readily occur to those of ordinary skill in the art. Accordingly, all such variations and modifications are included within the intended scope of the invention as defined by the following claims.

What is claimed is:

1. A method to form an EUV mask comprising:
   forming a ruthenium layer immediately adjacent a reflective multi-layer;
   forming an EUV absorber layer immediately adjacent the ruthenium layer.

2. The method of claim 1 further comprising forming a resist layer adjacent the EUV absorber layer, and patterning the resist layer to form a trench across the resist layer to an exposed portion of the underlying EUV absorber layer.

3. The method of claim 2 further comprising etching the exposed portion of the underlying EUV absorber layer and extending the trench to the ruthenium layer, to expose the underlying reflective multi-layer to EUV radiation directed through the trench.

4. The method of claim 3 wherein etching the exposed portion of the underlying EUV absorber layer and extending the trench to the ruthenium layer comprises introducing an etch chemistry highly selective to the EUV absorber layer, as opposed to the ruthenium layer.

5. The method of claim 4 wherein the EUV absorber layer comprises tantalum nitride, and wherein the etch chemistry comprises one from the group consisting of a fluorine etch chemistry and a chlorine etch chemistry.

6. The method of claim 3 further comprising irradiating the EUV absorber layer and trench with non-EUV radiation to inspect the absorber layer and trench.

7. The method of claim 6 further comprising repairing defects discovered during irradiating the EUV absorber layer and trench with non-EUV radiation.

8. The method of claim 7, wherein repairing defects comprises using an e-beam to etch or deposit material.

9. The method of claim 6 wherein forming an EUV absorber layer comprises forming a layer of EUV absorbing material immediately adjacent the ruthenium layer, and forming a layer of non-EUV-reflective material adjacent the layer of EUV absorbing material to decrease reflectivity of non-EUV radiation for enhanced inspection contrast.

10. The method of claim 9 wherein the EUV absorbing material comprises tantalum nitride, and the non-EUV-reflective material comprises tantalum oxynitride.

11. The method of claim 10 wherein forming a layer of EUV absorbing material comprises depositing a layer of tantalum nitride having a thickness between about 40 nanometers and about 70 nanometers, and wherein forming a layer of non-EUV-reflective material comprises depositing a layer of tantalum oxynitride having a thickness between about 10 nanometers and about 30 nanometers.

12. The method of claim 6 wherein the non-EUV radiation is from the group consisting of UV radiation and DUV radiation.

13. The method of claim 1 wherein the EUV absorber layer comprises tantalum nitride.

14. The method of claim 1 wherein forming a ruthenium layer comprises depositing a layer of ruthenium having a thickness between about 2 nanometers and about 6 nanometers.

15. An EUV mask structure comprising:

a reflective multi-layer;

a ruthenium layer;

and an EUV absorber layer;

the ruthenium layer being positioned immediately between the reflective multi-layer and the EUV absorber layer.

16. The mask structure of claim 15 wherein the EUV absorber layer comprises a layer of EUV absorbing material and a layer of non-EUV-reflective material for enhanced inspection contrast using non-EUV radiation, the layer of EUV absorbing material being positioned immediately adjacent the ruthenium layer.

17. The mask structure of claim 16 wherein the EUV absorbing material comprises tantalum nitride, and the non-EUV-reflective material comprises tantalum oxynitride.

18. The mask structure of claim 17 wherein the layer of tantalum nitride EUV absorbing material has a thickness between about 40 nanometers and about 70 nanometers, and wherein the layer of tantalum oxynitride non-EUV-reflective material has a thickness between about 10 nanometers and about 30 nanometers.

19. The mask structure of claim 15 wherein the ruthenium layer has a thickness between about 2 nanometers and about 6 nanometers.

20. The mask structure of claim 15 wherein the reflective multi-layer comprises about 40 pairs of alternating sublayers of molybdenum and silicon having thicknesses of about 2.8 nanometers and about 4.2 nanometers, respectively.

21. The mask structure of claim 15 wherein a trench is defined across the EUV absorber layer to expose the reflective multi-layer to incident EUV radiation directed through the trench and through the ruthenium layer.

22. The mask structure of claim 15 wherein the EUV absorber layer is a patterned EUV absorber layer that includes portions of EUV absorber material and trenches between the portions of EUV absorber material, the trenches extending substantially to the ruthenium layer.

23. The mask structure of claim 15 further comprising a substrate adjacent the reflective multi-layer, wherein the mask structure does not include a second reflective multi-layer further from the substrate than the ruthenium layer.

24. An EUV mask structure comprising:

a reflective multi-layer, a ruthenium layer immediately adjacent the reflective multi-layer;

a patterned EUV absorber layer; and wherein the ruthenium layer is positioned between the reflective multi-layer and the patterned EUV absorber layer.

25. The mask structure of claim 24 wherein the patterned EUV absorber layer comprises a layer of EUV absorbing material and a layer of non-EUV-reflective material for enhanced inspection contrast using non-EUV radiation, the layer of EUV absorbing material being positioned immediately adjacent the ruthenium layer.

26. The mask structure of claim 24, further comprising:

a substrate that does not include a second reflective multi-layer; and wherein the reflective multi-layer is positioned immediately adjacent the substrate.

27. The mask structure of claim 24 further comprising a substrate adjacent the reflective multi-layer, wherein the mask structure does not include a second reflective multi-layer further from the substrate than the ruthenium layer.

* * * * *